(12) United States Patent
Guyot et al.

(10) Patent No.: US 10,164,655 B2
(45) Date of Patent: Dec. 25, 2018

(54) CACHE OBLIVIOUS ALGORITHM FOR BUTTERFLY CODE

(71) Applicant: HGST Netherlands B.V., Amsterdam (NL)

(72) Inventors: Cyril Guyot, San Jose, CA (US); Robert Mateescu, San Jose, CA (US); Lluis Pamies-Juarez, San Jose, CA (US); Filip Blagojevic, Emeryville, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 203 days.

(21) Appl. No.: 14/865,411

(22) Filed: Sep. 25, 2015

(65) Prior Publication Data

US 2017/0093426 A1 Mar. 30, 2017

(51) Int. Cl.
*H03M 13/11* (2006.01)
*G06F 11/10* (2006.01)

(52) U.S. Cl.
CPC ......... *H03M 13/11* (2013.01); *G06F 11/1076* (2013.01)

(58) Field of Classification Search
None
See application file for complete search history.

(56) References Cited

U.S. PATENT DOCUMENTS

| | | |
|---|---|---|
| 6,158,017 A | 12/2000 | Han et al. |
| 7,290,199 B2 | 10/2007 | Forhan et al. |
| 2006/0123268 A1 | 6/2006 | Forhan et al. |
| 2010/0138719 A1 | 6/2010 | Lee et al. |
| 2011/0131467 A1 | 6/2011 | Weathers |
| 2011/0213925 A1 | 9/2011 | Ledford |
| 2012/0127003 A1* | 5/2012 | Shibahara ............ H04N 19/122 341/87 |
| 2012/0173932 A1 | 7/2012 | Li et al. |
| 2017/0093425 A1* | 3/2017 | Mateescu .......... H03M 13/3761 |

OTHER PUBLICATIONS

En Gad et al. "Repair-optimal MDS Array codes Over GF(2)" dated 2013, 5 pages, IEEE International Symposium on Information Theory.

(Continued)

*Primary Examiner* — Justin R Knapp
(74) *Attorney, Agent, or Firm* — Patent Law Works LLP

(57) ABSTRACT

Techniques for generating parities and repairing data erasures using a cache oblivious encoding algorithm are disclosed. The system includes an encoding module which receives a request to recreate data for a subset of a plurality of content stores from a storage manager. The encoding module generates a new first parity and a new second parity using the remaining content in the plurality of content stores. The encoding module generates a first portion of the requested data using the new first parity and a first parity for the plurality of content stores and a second portion of the requested data using the new second parity and a second parity for the plurality of content stores. The encoding module may recreate the data for the plurality of content stores using the first portion of the requested data and the second portion of the requested data.

9 Claims, 15 Drawing Sheets

(56) References Cited

OTHER PUBLICATIONS

Rashmi et al. "A Piggybacking Design Framework for Read-and Download-Efficient Distributed Storage Codes", dated 2013 5 pages, IEEE International Symposium on Information Theory.
First Office Action and Combined Search and Examination Report for GB Application No. GB1615759.6, dated Feb. 28, 2017, 7 pages.
Patent Examination Report No. 1 for AU Patent Application No. 2015249068, dated Dec. 23, 2015; 5 pages.
Canadian Examination Report, CA 2,942,973, dated Jan. 22, 2018 (6 pages).

* cited by examiner

CACHE OBLIVIOUS ALGORITHM FOR BUTTERFLY CODE

BACKGROUND

The present disclosure relates to a cache oblivious algorithm for generating parities for data recovery. In particular, the present disclosure relates to a cache oblivious algorithm for generating parities and repairing data erasures using a butterfly code encoding algorithm.

Various encoding algorithms are available for encoding and decoding large amounts of data. Previous encoding techniques have shown that a surprisingly large amount of time may be spent encoding/decoding the code words. Additionally, the time spent by the CPU increases as the number of drives storing the code words increases. Software implementations typically use the host CPU's cache in a sub-optimal manner while constructing the parities and repairing from erasure of any one drive storing data. Thus, there is a need for a single algorithm to access the cache optimally, such that the algorithm optimizes the software performance of butterfly encoding/decoding. Such algorithms may also be reused to repair erasure of data from one or more drives.

SUMMARY

The present disclosure relates to systems and methods for a cache oblivious algorithm to generate parities for data recovery.

According to one innovative aspect of the subject matter described in this disclosure may be embodied in computer-implemented methods that include retrieving a first subset of content from memory; updating a first parity for the content using the first subset of the content; updating a second parity for the content using an orthogonal permutation based on the first subset of content and a first correcting factor; retrieving a second subset of content from memory; updating the first parity for the content using the second subset of the content; and updating the second parity for the content using an inverse orthogonal permutation based on the second subset of content and a second correcting factor.

Other implementations of one or more of these aspects include corresponding systems, apparatus, and computer programs, configured to perform the actions of the methods, encoded on computer storage devices. It should be understood that the language used in the present disclosure has been principally selected for readability and instructional purposes, and not to limit the scope of the subject matter disclosed herein.

BRIEF DESCRIPTION OF THE DRAWINGS

The present disclosure is illustrated by way of example, and not by way of limitation in the figures of the accompanying drawings in which like reference numerals are used to refer to similar elements.

DETAILED DESCRIPTION

Systems and methods for generating parities and repairing data erasures using a cache oblivious encoding algorithm are described below. While the systems and methods of the present disclosure are described in the context of a particular system architecture, it should be understood that the systems and methods can be applied to other architectures and organizations of hardware.

Figure 1:
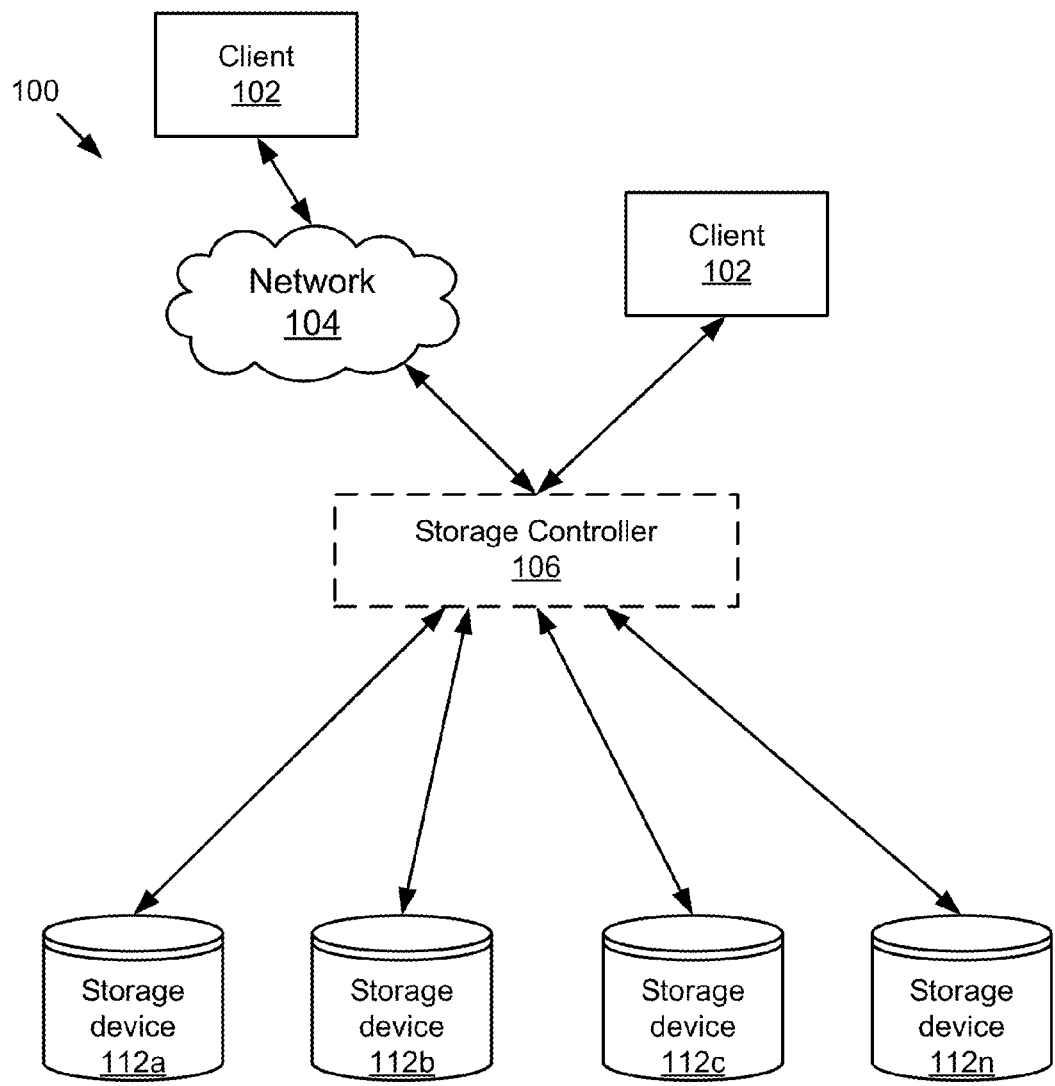
FIG. 1 is a high-level block diagram illustrating an example system including a storage system having multiple storage devices and a storage controller.

FIG. 1 is a high-level block diagram illustrating an example system 100 including a storage system having multiple storage devices and a storage controller. The system 100 includes clients 102a . . . 102n, a network 104, and a storage system including storage devices 112a . . . 112n. In some embodiments, the system 100 may optionally include a storage controller 106.

The client devices 102a . . . 102n can be any computing device including one or more memory and one or more processors, for example, a laptop computer, a desktop computer, a tablet computer, a mobile telephone, a personal digital assistant (PDA), a mobile email device, a portable game player, a portable music player, a television with one or more processors embedded therein or coupled thereto or any other electronic device capable of making storage requests. A client device 102 may execute an application that makes storage requests (e.g., read, write, etc.) to the storage devices 112. While the example of FIG. 1 includes two clients, 102a and 102n, it should be understood that any number of clients 102 may be present in the system. Clients may be directly coupled with storage sub-systems including individual storage devices (e.g., storage device 112a) or storage systems behind a separate controller.

In some embodiments, the system 100 includes a storage controller 106 that provides a single interface for the client devices 102 to access the storage devices 112 in the storage system. In various embodiments, the storage devices may be directly connected with the storage controller 106 (e.g., storage device 112a) or may be connected through a separate controller. The storage controller 106 may be a computing device configured to make some or all of the storage space on disks 112 available to clients 102. As depicted in the example system 100, client devices can be coupled to the storage controller 106 via network 104 (e.g., client 102a) or directly (e.g., client 102n).

The network 104 can be a conventional type, wired or wireless, and may have numerous different configurations including a star configuration, token ring configuration, or other configurations. Furthermore, the network 104 may include a local area network (LAN), a wide area network (WAN) (e.g., the internet), and/or other interconnected data paths across which multiple devices (e.g., storage controller 106, client device 112, etc.) may communicate. In some embodiments, the network 104 may be a peer-to-peer network. The network 104 may also be coupled with or include portions of a telecommunications network for sending data using a variety of different communication protocols. In some embodiments, the network 104 may include Bluetooth (or Bluetooth low energy) communication networks or a cellular communications network for sending and receiving data including via short messaging service (SMS), multimedia messaging service (MMS), hypertext transfer protocol (HTTP), direct data connection, WAP, email, etc. Although the example of FIG. 1 illustrates one network 104, in practice one or more networks 104 can connect the entities of the system 100.

Figure 2:
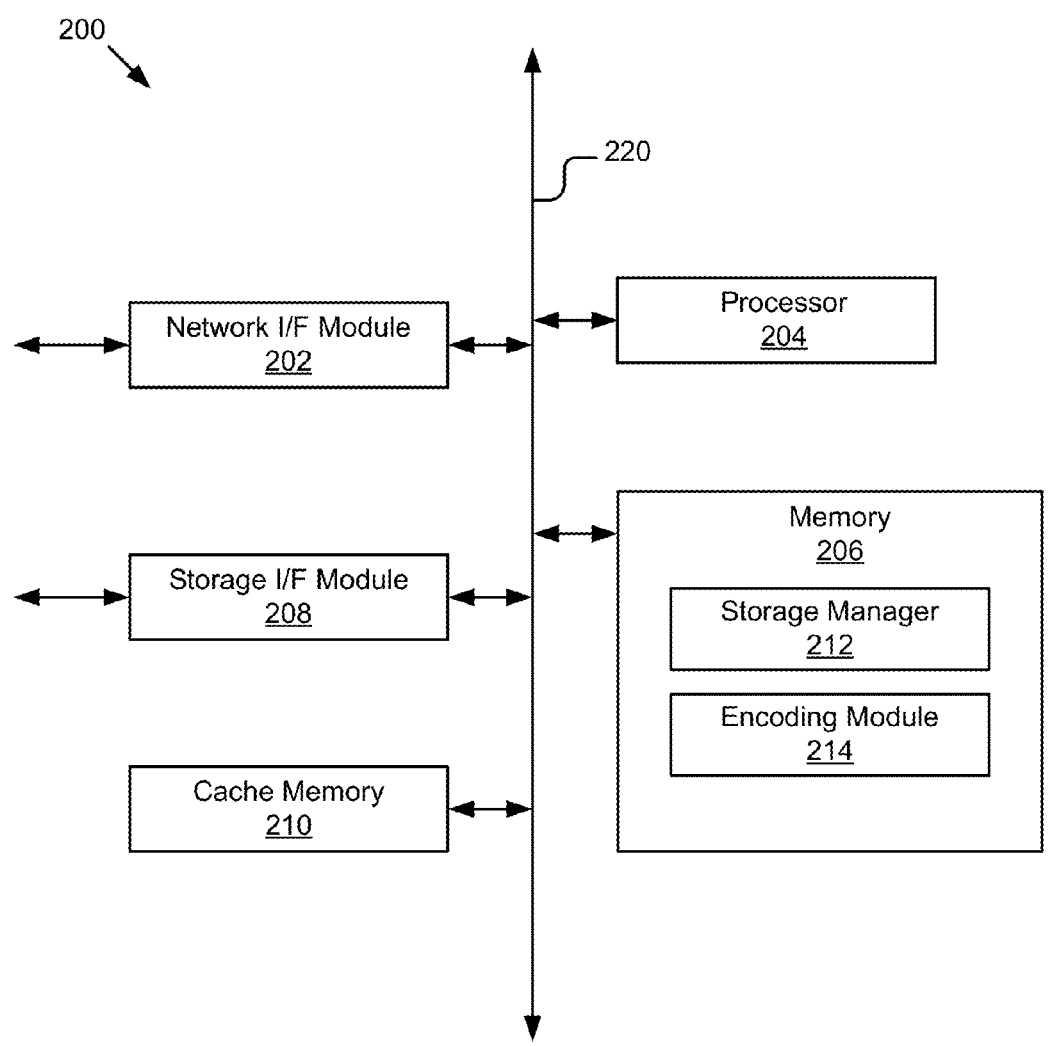
FIG. 2 is a block diagram illustrating an example system for use as a storage controller configured to implement techniques introduced herein.

FIG. 2 is a block diagram illustrating an example system 200 for use as a storage controller. In one embodiment, the system 200 may be a client device 102. In other embodiments, the system 200 may be storage controller 106. In the example of FIG. 2, the system 200 includes a network interface (I/F) module 202, a processor 204, a memory 206, a storage interface (I/F) module 208, and a cache memory 210. The components of the system 200 are communicatively coupled to a bus or software communication mechanism 220 for communication with each other.

The network interface module 202 is configured to connect system 200 to a network and/or other system (e.g., network 104). For example, network interface module 202 may enable communication through one or more of the internet, cable networks, and wired networks. The network interface module 202 links the processor 204 to the network 104 that may in turn be coupled to other processing systems. The network interface module 202 also provides other conventional connections to the network 104 for distribution and/or retrieval of files and/or media objects using standard network protocols such as TCP/IP, HTTP, HTTPS, and SMTP as will be understood. In some implementations, the network interface module 202 includes a transceiver for sending and receiving signals using WiFi, Bluetooth®, or cellular communications for wireless communication.

The processor 204 may include an arithmetic logic unit, a microprocessor, a general purpose controller or some other processor array to perform computations and provide electronic display signals to a display device. In some implementations, the processor 204 is a hardware processor having one or more processing cores. The processor 204 is coupled to the bus 220 for communication with the other components. Processor 204 processes data signals and may include various computing architectures including a complex instruction set computer (CISC) architecture, a reduced instruction set computer (RISC) architecture, or an architecture implementing a combination of instruction sets. Although only a single processor is shown in the example of FIG. 2, multiple processors and/or processing cores may be included. It should be understood that other processor configurations are possible.

The memory 206 stores instructions and/or data that may be executed by the processor 204. In the illustrated implementation, the memory 206 includes a storage manager 210 and an encoding module 214. Although depicted as distinct modules in the example of FIG. 2, the storage manager 210 may include the encoding module 214 or perform the functions of the encoding module as described herein. The memory 206 is coupled to the bus 220 for communication with the other components of the system 200. The instructions and/or data stored in the memory 206 may include code for performing any and/or all of the techniques described herein. The memory 206 may be, for example, non-transitory memory such as a dynamic random access memory (DRAM) device, a static random access memory (SRAM) device, flash memory, or some other memory devices. In some implementations, the memory 206 also includes a non-volatile memory or similar permanent storage device and media, for example, a hard disk drive, a floppy disk drive, a compact disc read only memory (CD-ROM) device, a digital versatile disc read only memory (DVD-ROM) device, a digital versatile disc random access memories (DVD-RAM) device, a digital versatile disc rewritable (DVD-RW) device, a flash memory device, or some other non-volatile storage device.

Software communication mechanism 220 may be an object bus (e.g., CORBA), direct socket communication (e.g., TCP/IP sockets) among software modules, remote procedure calls, UDP broadcasts and receipts, HTTP connections, function or procedure calls, etc. Further, any or all of the communication could be secure (SSH, HTTPS, etc.). The software communication mechanism 220 can be implemented on any underlying hardware, for example, a network, the Internet, a bus, a combination thereof, etc.

The storage I/F module 208 cooperates with the storage manager 210 to access information requested by the client 102. The information may be stored on any type of attached array of writable storage media, such as magnetic disk or tape, optical disk (e.g., CD-ROM or DVD), flash memory, solid-state drive (SSD), electronic random access memory (RAM), micro-electro mechanical and/or any other similar media adapted to store information, including data and parity information. However, as illustratively described herein, the information is stored on disks 112. The storage I/F module 208 includes a plurality of ports having input/output (I/O) interface circuitry that couples with the disks over an I/O interconnect arrangement.

The cache memory 210, stores data that may be accessible by the processor 204 and/or other components of the system 200. In the illustrated implementation, the cache memory 210 is coupled to the bus 220 for communication with the other components of the system 200. The cache memory 210 may be, for example, RAM that the processor 204 can access more quickly than main memory (e.g., memory 206 or disks 112). Although only a single cache memory is shown in the example of FIG. 2, multiple cache memories may be included in system 200. It should be understood that other configurations of cache memory are possible.

The storage manager 212, stored on memory 206 and configured to be executed by processor 204, facilitates access to data stored on the disks 112. In certain embodiments, the storage manager 212 logically organizes data as a hierarchical structure of named directories and files on the disks 112. The storage manager 212 cooperates with the encoding module 214 to encode data stored on the disks for recovery in the event of a failure of one or more disks. The storage manager, in some embodiments, may detect a failure of a disk and cooperate with the encoding module 214 to recreate the data stored on the failed disk.

Encoding module 214 may be stored in memory 206 and configured to be executed by processor 204. The encoding module 214 is configured to encode parity data for a plurality of content stores. In one embodiment, to generate the parity data, the encoding module 214 encodes content stored to storage devices 112 to generate two parities of the content stored to storage devices 112. In one embodiment, the first parity of the content stored to the storage devices 112 is a horizontal parity. For example, assuming the content is stored across four content stores (e.g., storage devices 112), the first data element of each content store is combined to create the first element of the first parity. In one embodiment, the first data element of each content store is combined using an "exclusive or" (XOR) operation to create the first element of the first parity. To increase efficiency by reducing non-cache memory access, the encoding module 214 may be configured to update the first parity in a recursive manner as described in more detail below.

In one embodiment, to create a second parity, the encoding module 214 may generate a first orthogonal permutation of a first subset of the content stored to storage devices 112 and a second orthogonal permutation of a second subset of content from the storage devices 112 in an inverse orientation to the first orthogonal permutation. For example, the encoding module 214 retrieves a first subset of content from memory and generates a first orthogonal permutation of the retrieved content. In some embodiments, the encoding module 214 adds a correcting factor to the first orthogonal permutation. The encoding module 214 may then retrieve a second subset of content from memory and generates a second orthogonal permutation of the retrieved content in an inverse orientation to the first orthogonal permutation. The encoding module 214 may, in some embodiments, add a correcting factor to the second orthogonal permutation. The generation of the second parity in this technique facilitates efficient use of cached data elements to add correcting factors from the first parity that may still be in cache memory 210. Thus, the encoding module 214 encodes content stored to the storage devices 112 using a recursive orthogonal permutation of the content, the correcting factors, and content retrieved from the cache memory 210.

In some embodiments, the encoding module 214 is configured to recreate lost content that was stored to a content store. In some embodiments, the encoding module 214 may repair failure of one or more disks by accessing only half of the remaining content. To repair the failure, the encoding module may 214 generate a new first parity and a new second parity for the remaining content using the techniques described above. The new first parity and the new second parity can be compared to original parities to recover the lost data. The comparison may include computing a first XOR operation on the new first parity and the first parity for the content stored to the plurality of content stores to generate a first portion of the lost content and a second XOR operation on the new second parity and the second parity for the content stored to the plurality of content stores to generate a second portion of the lost content. The encoding module 214 may recreate the lost content using the first portion of the lost content and the second portion of the lost content.

Figure 3:
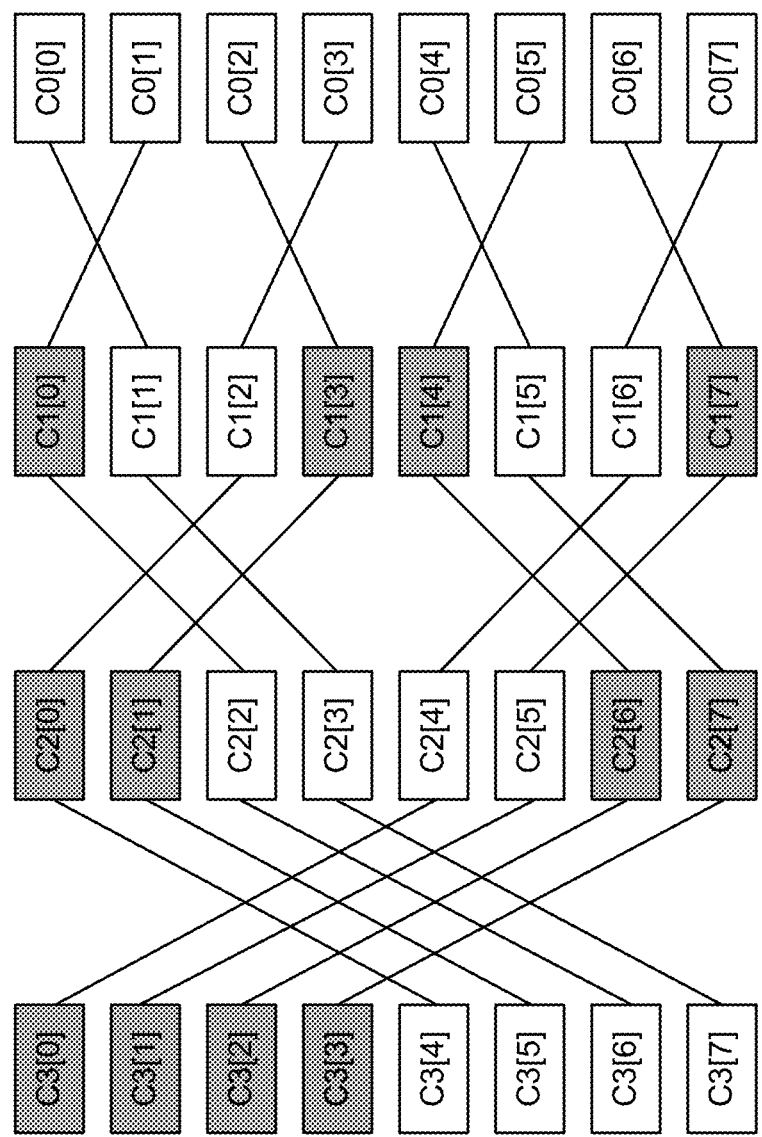
FIG. 3 is a block diagram illustrating a cache oblivious algorithm construction for content stored across four content stores, according to the techniques described herein.

FIG. 3 is a block diagram illustrating a cache oblivious algorithm construction for content stored across four content stores. The example construction depicted in FIG. 3 illustrates a basic principle of the construction of the butterfly code. In the example construction shown in FIG. 3, each of the content stores contains eight data elements. In general, for k content stores, the number of elements in each content store is $2^{k-1}$. The information element in column i and row j is denoted as Ci[j]. There are two parity nodes created for the content stored across the four content stores. The parities are created using a cache oblivious algorithm. The second parity is encoded according to the lines in FIG. 3. For each P2[i], the parity is encoded using the line corresponding to element C0[i]. For example, the first element of the second parity P2[0] is encoded according to the line that starts at element C0[0].

The element P2[i] is encoded as the parity of data elements in the line corresponding to data element CON. In addition, if there are shaded elements in the line, a correcting factor is added to P2[i]. In one embodiment, for each shaded element in the line, the correcting factor includes all elements depicted to the right of the shaded element in the example construction of FIG. 3. For example, for the second element in the second parity (P2[1]=C0 [1]+C1[0]+C2 [2]+C3 [6]+C0[0]), the elements C0[1], C1[0], C2 [2] and C3 [6] form the parity element using the construction in FIG. 3. Additionally, since C1[0] is shaded, the element to the right of C1[0] (C0[0]) is also added to the parity element.

The shaded elements in FIG. 3 are those Ci[j], for which the ith bit in the binary representation of j over k−1 bits is equal to i−1th bit, where, if the i−1th bit is −1, the −1th bit is considered as 0, and k is the total number of content stores. In the example of FIG. 3, where k=4 and in the case of C1[3], the binary representation of j over k−1 bits is 011 (i.e., j=3 and k−1=3). Continuing with the example of C1[3], where i=1, the ith bit is the 1st bit and the i−1th bit is the 0th bit. In the binary representation 011, the 0th bit is 1, the 1st bit is 1 and the 2nd bit is 0. Thus, since the the ith bit is equal to the i−1th bit (i.e., the $1^{st}$ bit and the $0^{th}$ bit are both 1), the element is shaded and a correcting factor is added to the second parity along with the element C1[3]. The first parity and the second parity are described below in more detail with reference to FIGS. 4, 5A, and 5B.

Figure 4:
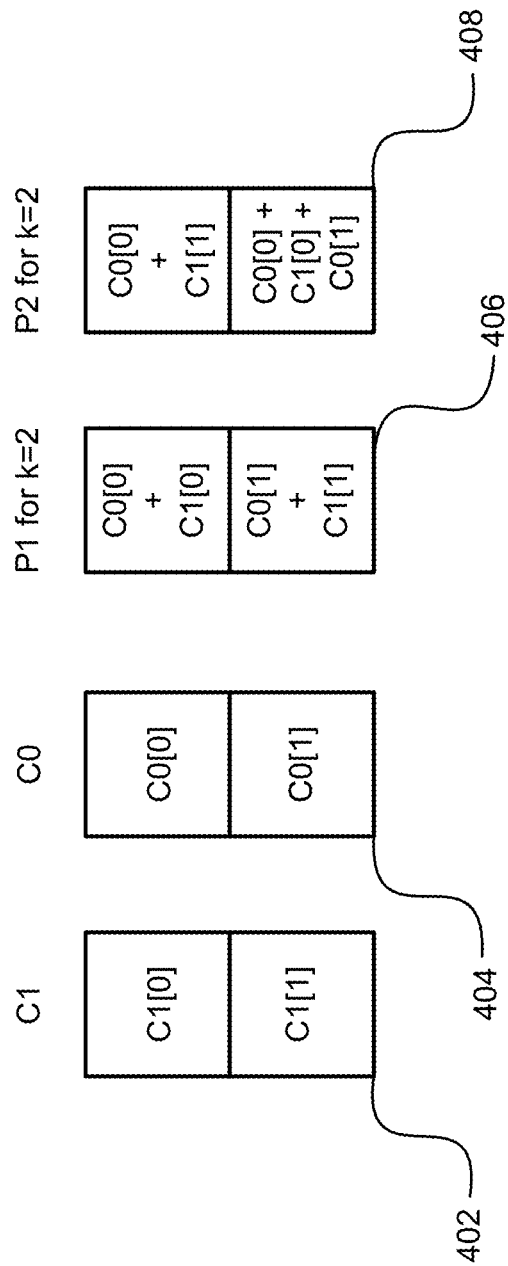
FIG. 4 is a block diagram illustrating contents of two content stores, a first parity, and a second parity for the two content stores, according to the techniques described herein.

FIG. 4 is a block diagram illustrating contents of two content stores, a first parity, and a second parity for the two content stores. In the example of FIG. 4, the content stores 402 and 404 are referred to as C1 and C0, respectively below. The first parity 406 is referred to below as P1 and the second parity 408 is referred to below as P2. In this example, the first data element (e.g., bit, byte, block, or the like) stored to content store C0 is C0[0], the first data element stored to content store C1 is C1[0], the second data element stored to content store C0 is C0[1], and the second data element stored to content store C1 is C1[1]. While depicted in the example of FIG. 4 as distinct content stores, it should be understood that one or more of the content stores may be stored on the same hardware or various hardware devices.

In some embodiments, the encoding module 214 encodes content stored to the content stores 402 and 404 to generate the first parity 406 and the second parity 408. In one embodiment, to generate the first parity, a combinatorial circuit may be used to "XOR" all of the corresponding bits stored to content stores C0 and C1. For example, as described above, the first data element of the first parity 406 is a horizontal parity of the first data elements of content stores 402 and 404. As shown in the example of FIG. 4, the first data element of the first parity 406 is represented by C0[0]+C1[0] in the first row, which is calculated by XOR-ing C0[0] from the first row of C0 and C1[0] from the first row of C1. In some embodiments, the second parity P2 may be generated using an orthogonal permutation of the content from the content stores C0 and C1 and a correcting factor. The relation between C0, C1, P1 and P2 can be shown as:

$P1[0]=C0[0]+C1[0];$ $P1[1]=C0[1]+C1[1];$ $P2[1]=P1[0]+C0[1];$ $P2[0]=C0[0]+C1[1];$

In the above example, the first element of first parity P1 is P1[0], the second element of first parity P1 is P1[1], the first element of second parity P2 is P2[0] and the second element of second parity P2 is P2[1]. As can be seen, generation of first parity P1 and second parity P2 using the above equations in a recursive manner as described herein results in efficient computation since non-cache memory accesses are reduced.

Figure 5A:
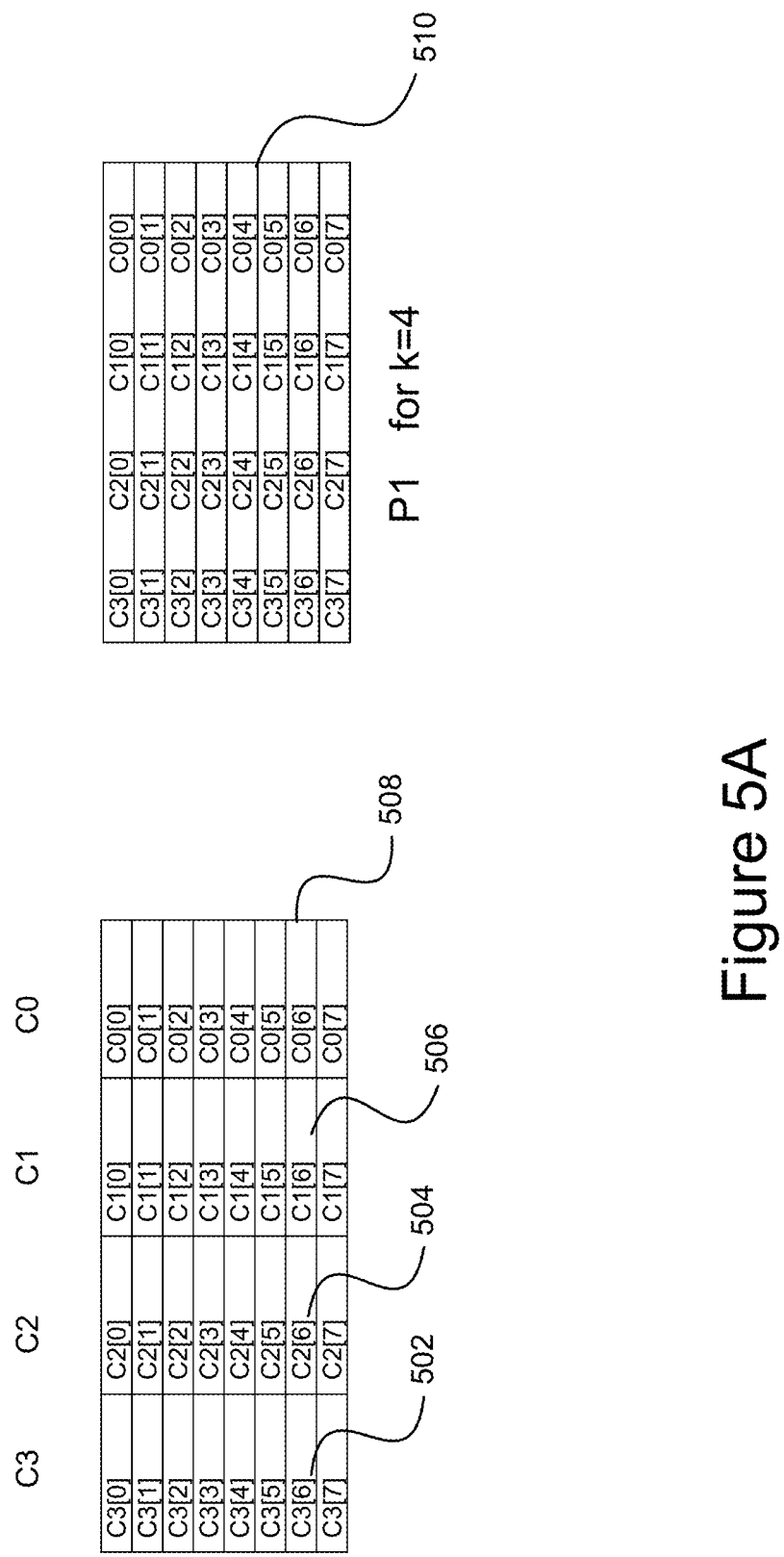
FIGS. 5A and 5B depict block diagrams illustrating contents of four content stores, a first parity, and a second parity for the four content stores, according to the techniques described herein.
Figure 5B:
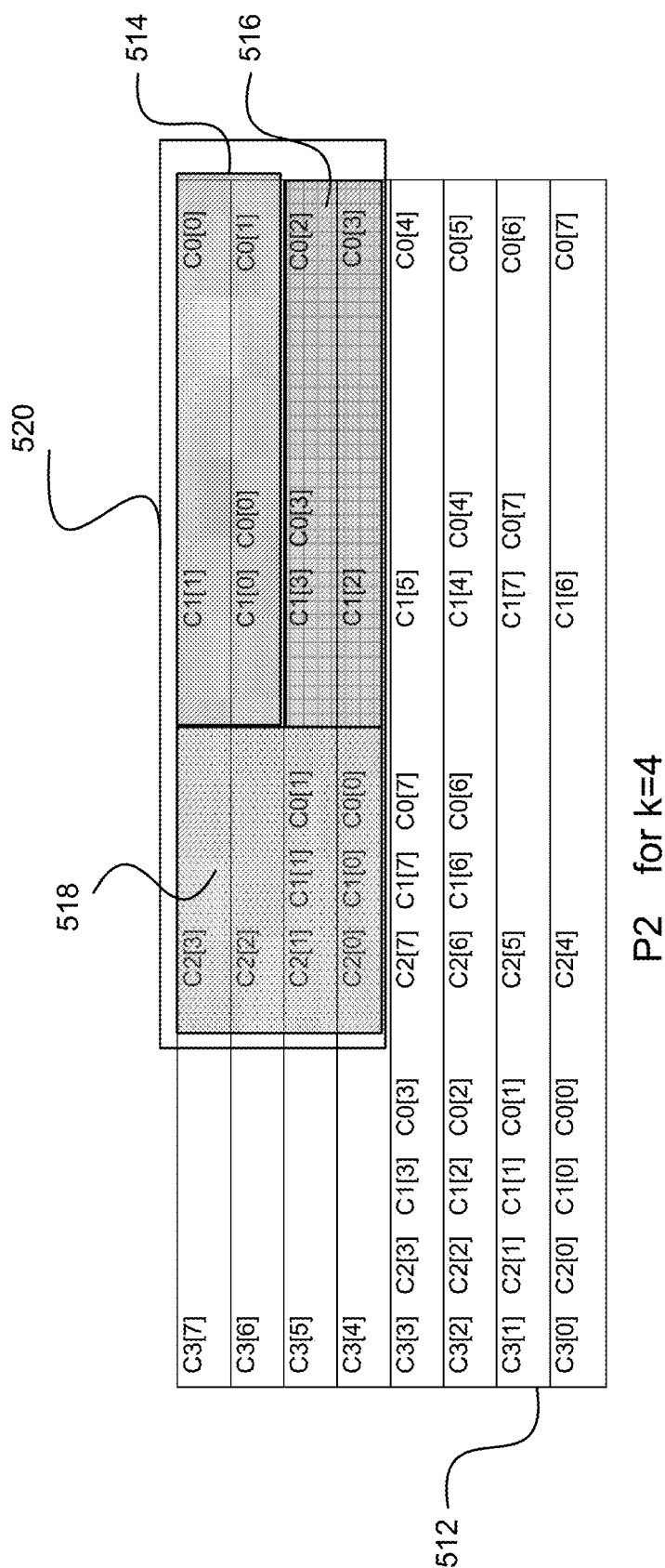

FIGS. 5A and 5B depict a block diagram illustrating contents of four content stores, a first parity, and a second parity for the four content stores. In the example of FIGS. 5A and 5B, the first parity and the second parity are generated according to a butterfly code construction. Butterfly code is a 2-parity maximum distance separable (MDS) erasure code over GF(2) with an efficient recovery ratio. The butterfly code has a code rate of k/k+2, where k is the number of systematic nodes or contents stores in the system. The MDS property of the butterfly code allows for recovery from any two systematic node failures. The butterfly code has an additional property that allows for recovery from failure of one content store using only half of the remaining data. While the parities in the examples of the remaining figures herein are described with reference to a butterfly code, the parities may be generated using any encoding construction (e.g., zigzag code, butterfly code) using the cache oblivious techniques described herein.

In the example of FIG. 5A, the content stores 502-508 are referred to as C0, C1, C2, and C3, respectively, and the first parity 504 is referred to as P1. As described above, the first parity 510 may be calculated as a horizontal parity of the data elements in the content stores 502-508. For example, the first data element of P1 includes C0[0], C1[0], C2[0] and C3[0] which is calculated by the XOR combination of the first data element of each content store. While depicted in the example of FIGS. 5A and 5B as distinct content stores and parities, it should be understood that one or more of the content stores and the parities may be stored on the same hardware or various hardware devices.

The parities may be generated in a recursive manner as described with reference to FIG. 6. For example, the encoding module 214 encodes the first two data elements stored to content stores C0 and C1 to generate a first portion 514 of the second parity 512. The first portion 514 is a butterfly code for k=2 (e.g., for two data stores) and an orthogonal permutation of the first two data elements stored to the content stores C0 and C1 and a correcting factor. In one embodiment, the encoding module may calculate the first portion 514 using techniques described above with reference to FIG. 3. The encoding module may then generate a second portion 520 of the second parity 512. The second portion 520 of the second parity 512 is a second parity for k=3, generated using cache oblivious butterfly code and includes the first portion 514 including a first orthogonal permutation and a correcting factor, a second portion 516 including a second orthogonal permutation in an inverse orientation to the first and a correcting factor, and a portion 518 including the data from the content store C2 and a correcting factor. A subset of the portion 518 is included in the first parity 510 and likely stored in cache. Thus, the construction of the second parity 512 may be broken down into recursively smaller constructions of two k−1 constructions and correcting factors.

As described, the generation of the second parity of the content stores C0, C1, C2 and C3 can be performed in a recursive manner. As described in examples of FIGS. 3, 5A and 5B, the correcting factor for the first orthogonal permutation and the correcting factor for the second orthogonal permutation in an inverse orientation to the first are portions of the first parity. Thus, generating the second parity using data elements from the first parity is advantageous because this construction allows for more efficient use of cache memory in generating the second parity.

Figure 6:
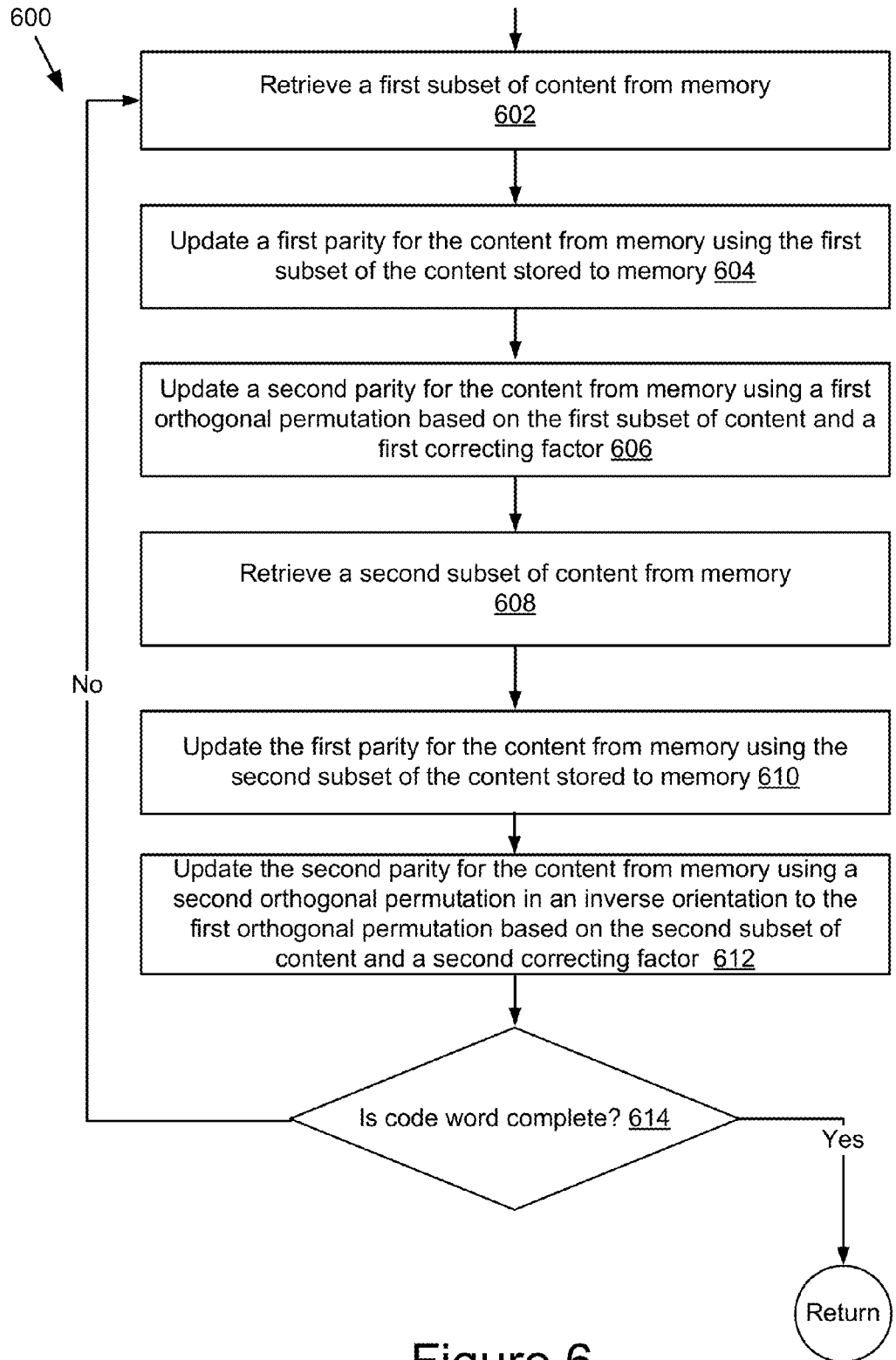
FIG. 6 is a flowchart of an example method for encoding content stored to a plurality of content stores to generate a first parity and a second parity, according to the techniques described herein.

FIG. 6 is a flowchart of an example method 600 for encoding data stored to a plurality of content stores to generate a first parity (e.g., P1 as shown in the examples of FIGS. 3, 4 and 5) and a second parity (e.g., P2 as shown in the examples of FIGS. 3, 4 and 5). At 602, the encoding module 214 retrieves a first subset of content from memory. In one embodiment, the memory may be a primary memory, for example, non-transitory memory such as a dynamic random access memory (DRAM) device and a static random access memory (SRAM). In one embodiment, the memory may include systematic nodes residing on separate disks. In another embodiment, the memory may include content stores residing on the same disk. The encoding module 214 may retrieve the content in response to a request to encode data (e.g., when the memory includes a threshold amount of data). In some embodiments, the encoding module 214 may be configured to encode content as it is received from a client device 102 and stored to disk 112.

Figure 7A:
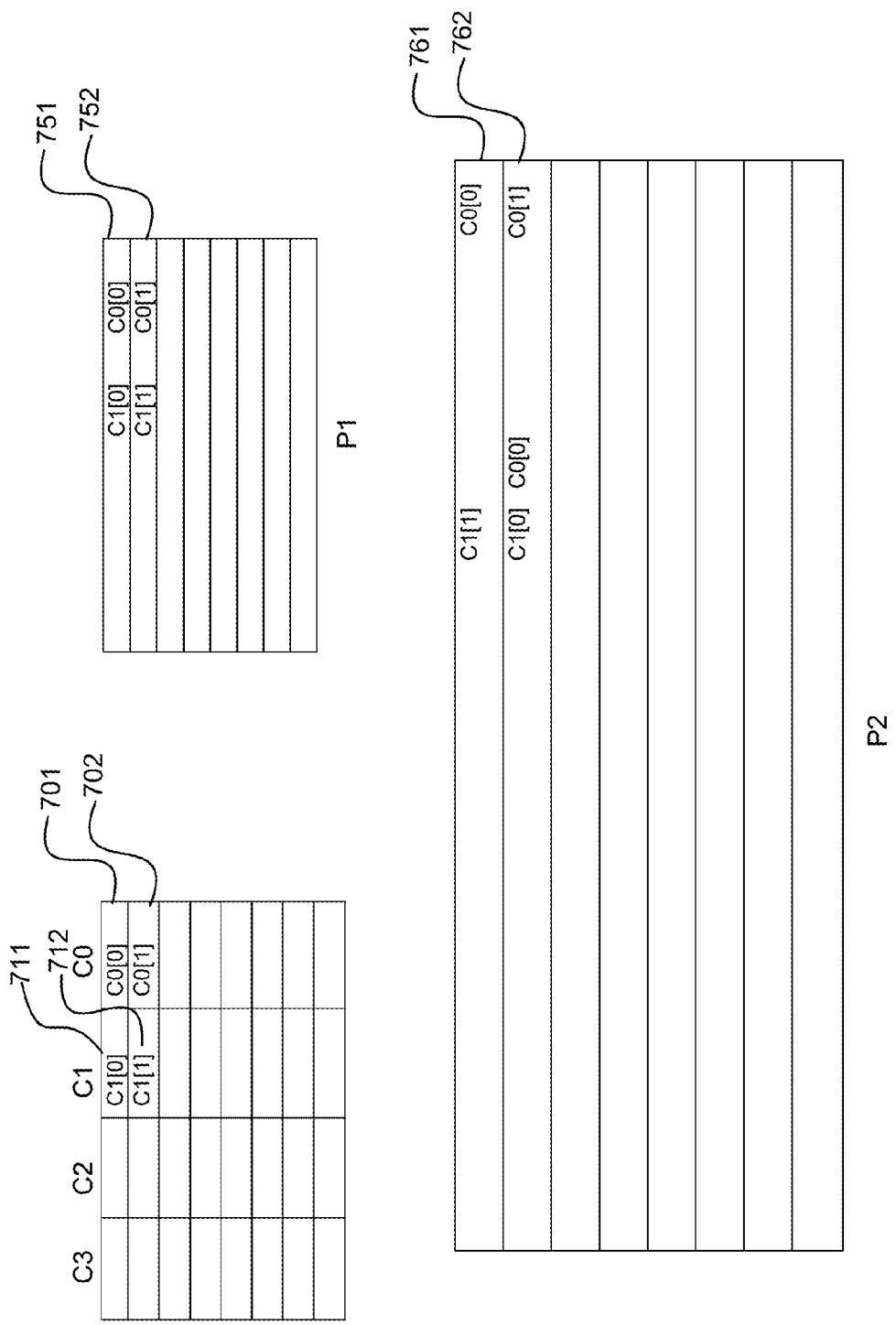
FIGS. 7A-7F depict block diagrams illustrating an example of encoding content stored to four content stores in a recursive manner, according to the techniques described herein.

In the example of FIG. 7A, the encoding module 214 retrieves data elements C0[0], C0[1], C1[0] and C1[1] from memory and writes them to content stores C0 and C1. Returning to the example of FIG. 6, at 604, the encoding module 214 updates a first parity for the content from memory using the first subset of the content from memory. The encoding module 214 calculates the first parity as a horizontal parity for the first subset of content from memory. For example, the first element of the first parity is calculated by performing an XOR operation on the first data element (e.g., bit, byte, block, etc.) of each content store from the plurality of content stores. As depicted in the example of FIG. 7A, the encoding module 214 calculates the first data element 751 of the first parity P1 by performing an XOR operation on the first data element 701 of the first content store (C0[0]) and the first data element 711 of the second content store (C1[0]). Similarly, the second data element 752 of P1 is calculated by performing an XOR operation on the second data element 702 of the first content store (C0[1]) and the second data element 712 of the second content store (C1[1]).

Returning to the example of FIG. 6, the encoding module 214 updates 606 a second parity for the content from memory using a first orthogonal permutation based on the first subset of content and a first correcting factor. For example, the first orthogonal permutation may be generated using the construction described in FIG. 3. The first correcting factor may be determined based on the subset of content stores in memory. As shown in the example of FIG. 7A, the first orthogonal permutation based on the first subset of content results in the combination of C0[0] and C1[1] in the first data element 761 of the second parity P2 and the combination of C0[1] and C1[0] in the second data element 762 of the second parity P2. The first correcting factor in the example of FIG. 7A is C0[0] in the second data element 762 of P2. Thus, a portion of the first correcting factor is a part of the first parity. In this example, C0[0] is a part of the first data element 751 of the first parity P1. During the construction of the second data element 762 of P2, since the combination of C1[0] and C0[0] was performed to update P1 and is likely still in cache, the first element 762 of P2 may be calculated by combining C0[1] with the first data element 751 of the first parity (C1[0]+C0[0]) from cache. This is advantageous, as it will result in higher number of cache hits during encoding of data elements for P2 and decrease the total time to generate the parities.

Figure 7B:
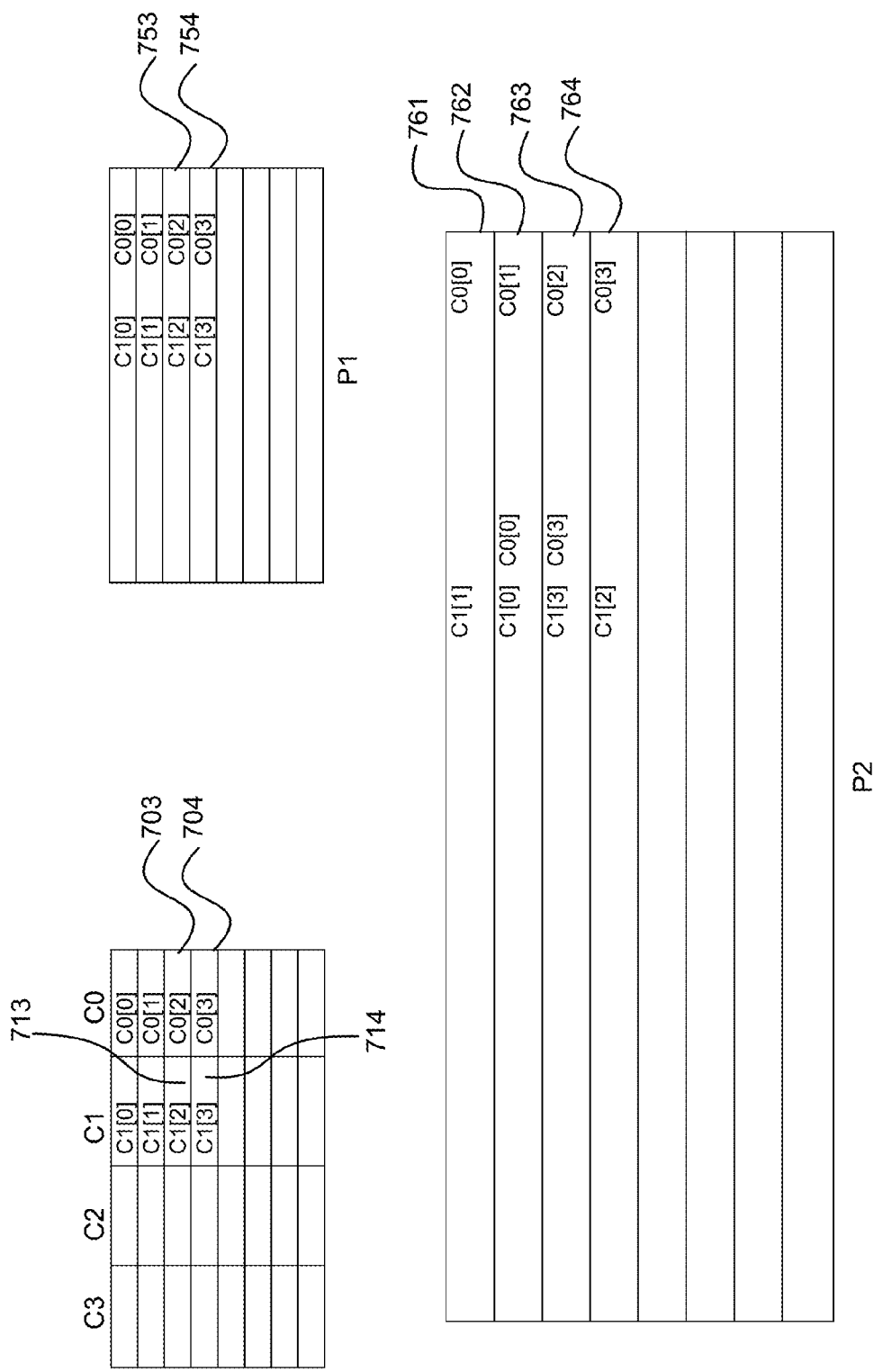

Returning to FIG. 6, the encoding module 214 retrieves 608 a second subset of content from memory. As depicted in the example of FIG. 7B, the encoding module 214 retrieves the third data element 703 of the first content store (C0[2]), the fourth data element 704 of the first content store (C0[3]), the third data element 713 of the second content store (C1[2]), and the fourth data element 714 of the second content store (C1[3]) from memory and writes them to content stores C0 and C1 respectively. Returning again to FIG. 6, the encoding module 214 updates 610 the first parity P1 for the content from memory using the second subset of the content from memory. For example, as shown in FIG. 7B, the encoding module 214 updates the third data element 753 of the first parity P1 by performing an XOR operation on the third data element 703 of the first content store (C0[2]) and the third data element 713 of the second content store (C1[2]). Similarly, the fourth data element 754 of P1 is calculated by performing an XOR operation on the fourth data element 704 of the first content store (C0[3]) and the fourth data element 714 of the second content store (C1[3]).

Referring back to FIG. 6 the encoding module 214 updates 612 the second parity for the content from memory using a second orthogonal permutation in an inverse orientation to the first orthogonal permutation based on the second subset of content and a second correcting factor. For example, the second orthogonal permutation in an inverse orientation to the first orthogonal permutation may be generated as shown in the example described in FIG. 7B. In the example of FIG. 7B, the second orthogonal permutation in an inverse orientation to the first orthogonal permutation based on the second subset of content results in a combination of C0[2] and C1[3] in the third data element 763 of the second parity P2 and a combination of C0[3] and C1[2] in the fourth data element 764 of the second parity P2. The second correcting factor in the example of FIG. 7B is C0[3] in the third data element 763 of P2. Again, the combination of elements C1[3] and C0[3] is data element 754 of P1 and can be used to generate the second parity.

The data elements of the second orthogonal permutation are similar to the elements from the first orthogonal permutation, however in an inverse orientation. For example, as shown in FIG. 7B, the third data element 763 of P2 includes the second subset of retrieved data elements and is similar to the second data element 762 of P2. The fourth data element 764 of P2 is also similar to the first data element 761 of P2. The addition of the first and the second correcting factor in the recursive manner, is advantageous because it provides more efficient accesses to the cache memory 210 while calculating the second parity of the content from the plurality of content stores.

Figure 7C:
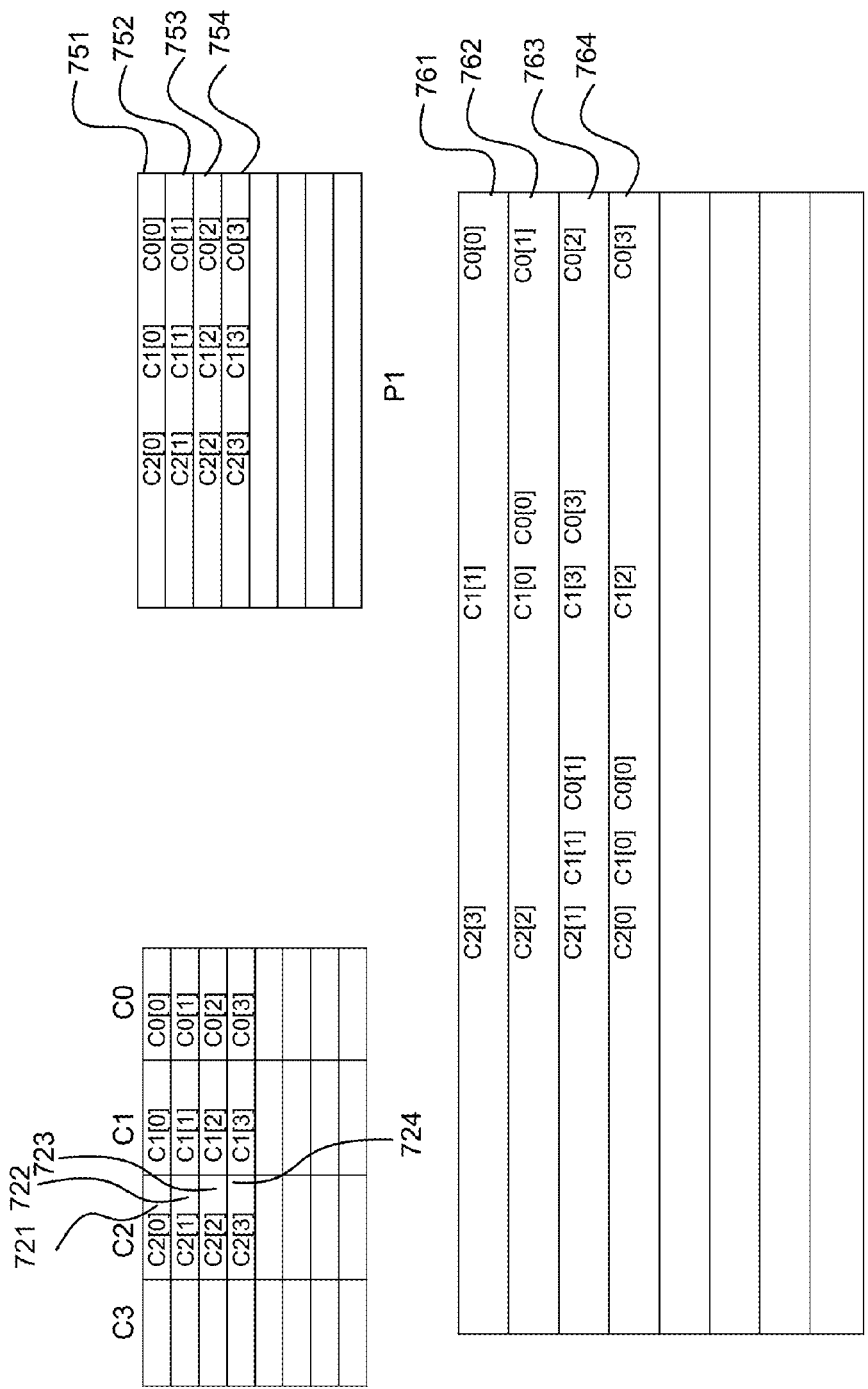

Referring back to FIG. 6, the encoding module 214 determines 614 if the code word is complete. In the example FIGS. 7A-7F, the code word includes a complete set of data elements to fill k content stores (e.g., C0, C1, C2 and C3). In this construction, each of the k content stores include $2^{k-1}$ data elements, thus resulting in a code word size of $(k*2^{k-1})$. In the example of k=4, as shown in FIGS. 5 and 7, the code word size is 32 data elements. In response to determining that the code word is not complete, the method 600 recursively performs the above described steps. The additions to the parities in a second iteration of the method 600 are depicted in the example of FIG. 7C. The encoding module 214 updates the parities, in the following order: the first data element 751 of the first parity P1 using the first data element 721 of the third content store (C2[0]); the fourth data element 764 of the second parity P2 using the first data element 751 of the first parity P1 (C2[0]+C1[0]+C0[0]) to increase the likelihood that the data element is stored in cache; the second data element 752 of the first parity P1 using the second data element 722 of the third content store (C2[1]); the third data element 763 of the second parity P2 using the second data element 752 of the first parity P1 (C2[1]+C1[1]+C0[1]); the third data element 753 of the first parity P1 using the third data element of the third content store (C2[2]); the second data element 762 of the second parity P2 using the third data element of the third content store (C2[2]); the fourth data element 754 of the first parity P1 using the fourth data element of the third content store (C2[3]); and the first data element 761 of the second parity P2 using the fourth data element of the third content store (C2[3]). In the example of FIG. 7C, the second parity P2 represents the orthogonal permutation of the data elements retrieved from memory, including C2[0], C2[1], C2[2], and C2[3], and correcting factors.

Figure 7D:
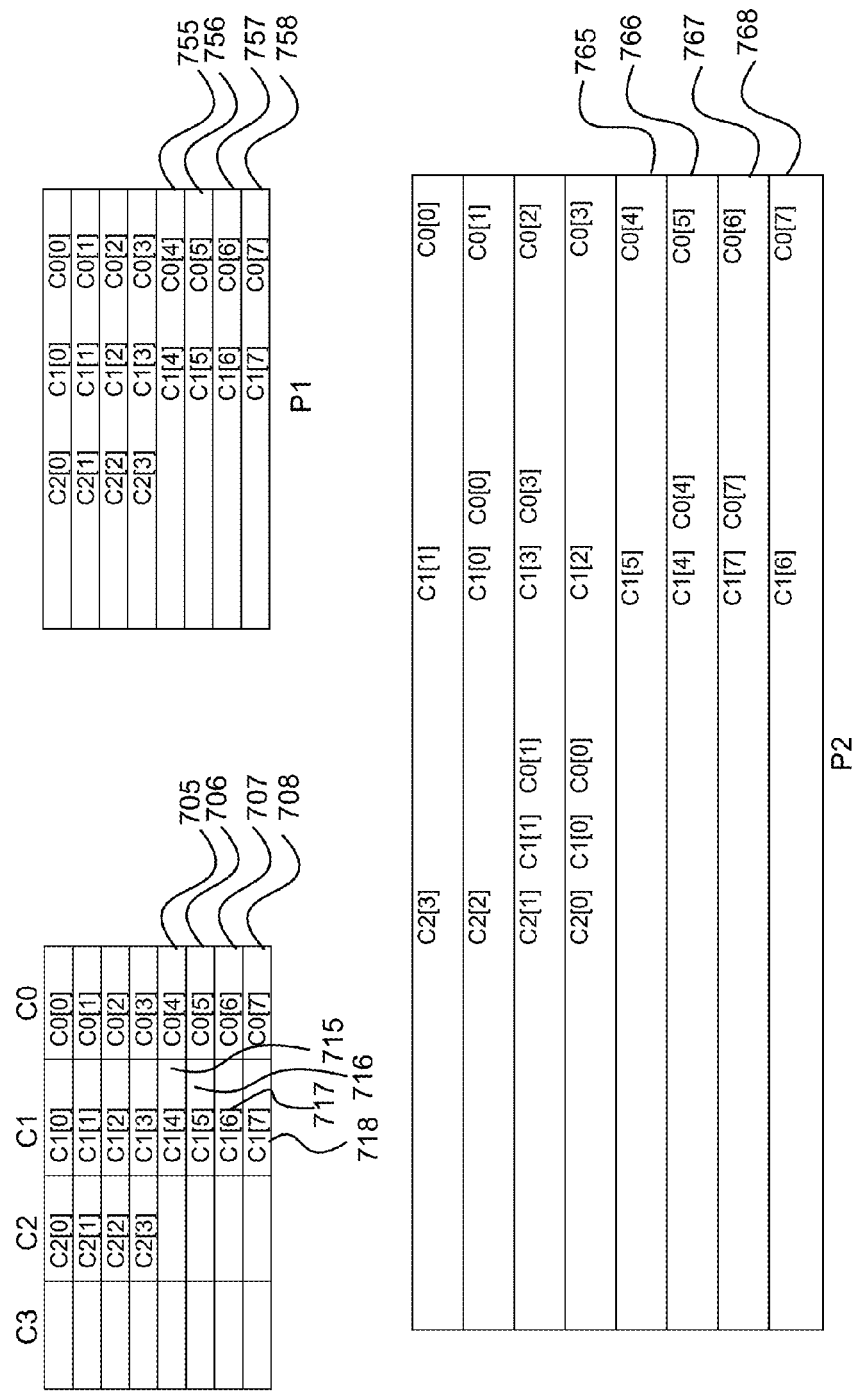

The encoding module 214 continues the method 600 as shown in the example of FIG. 7D. The encoding module 214 updates the parities in the following order: the fifth data element 755 of the first parity P1 using the fifth data element 705 of the first content store (C0[4]) and the fifth data element 715 of the second content store (C1[4]); the sixth data element 756 of the first parity P1 using the sixth data element 706 of the first content store (C0[5]) and the sixth data element 716 of the second content store (C1[5]); the fifth data element 765 of the second parity P2 using the fifth data element 705 of the first content store (C0[4]) and the sixth data element 716 of the second content store (C1[5]); the sixth data element 766 of the second parity P2 using the fifth data element 755 of the first parity (C1[4]+C0[4]) and the sixth data element 706 of the first data store (C0[5]); the seventh data element 757 of the first parity P1 using the seventh data element 707 of the first content store (C0[6]) and the seventh data element 717 of the second content store (C1[6]); the eighth data element 758 of the first parity P1 using the eight data element 708 of the first content store (C0[7]) and the eight data element 718 of the second content store (C1[7]); the seventh data element 767 of the second parity P2 using the eighth data element 758 of the first parity (C1[7]+C0[7]) and the seventh data element 707 of the first content store (C0[6]); and the eighth data element 768 of the second parity P2 using the seventh data element 717 of the second content store (C1[6]) and the eighth data element 708 of the first content store C0[7].

Figure 7E:
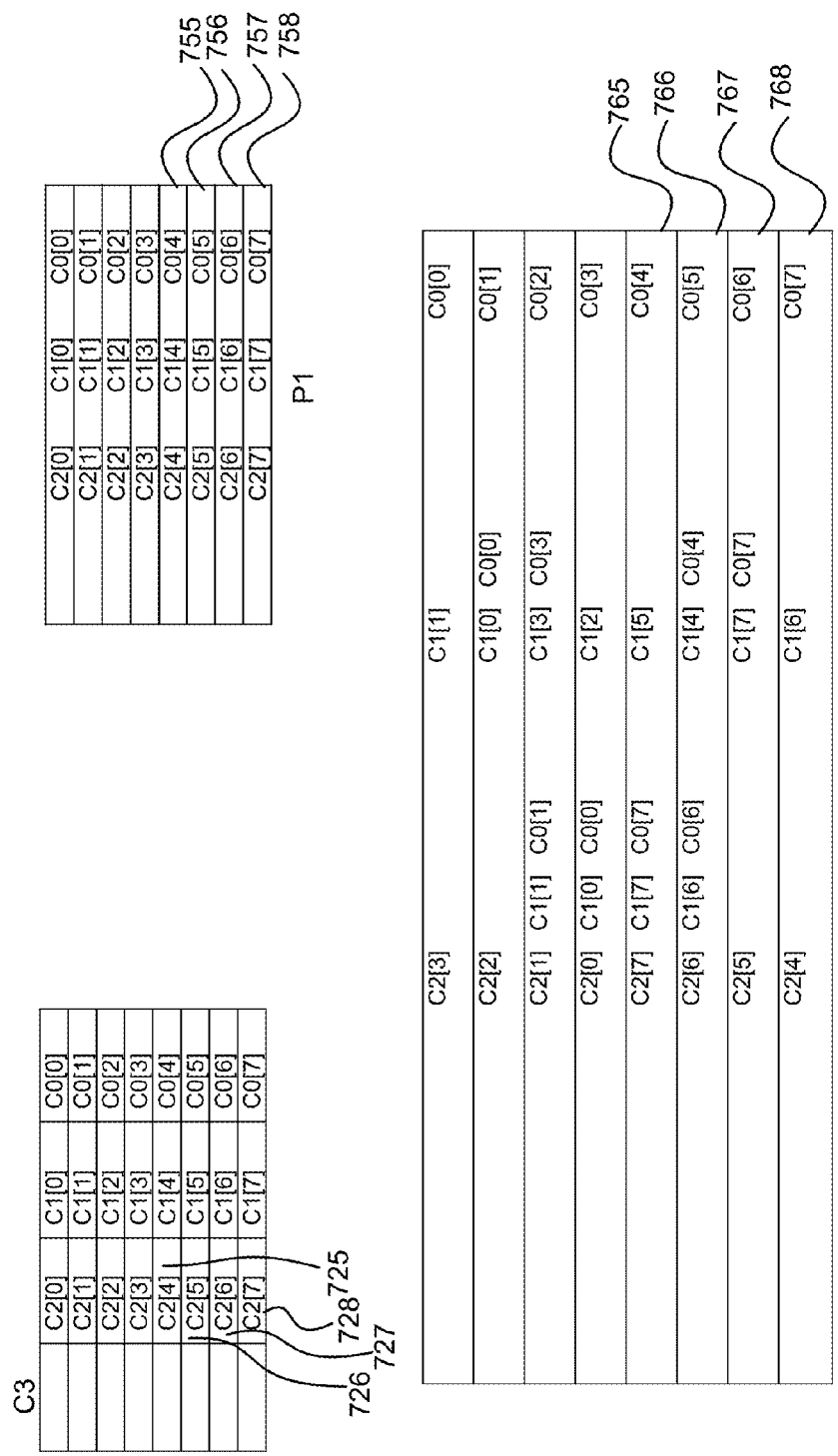

The encoding module 214 continues the method 600 as shown in the example of FIG. 7E. The encoding module 214 updates the parities in the following order: the fifth data element 755 of the first parity P1 using the fifth data element 725 of the third content store (C2[4]); the eighth data element 768 of the second parity P2 using the fifth data element 725 of the third content store (C2[4]); the sixth data element 756 of the first parity P1 using the sixth data element 726 of the third content store (C2[5]); the seventh data element 767 of the second parity P2 using sixth data element 726 of the third content store (C2[5]); the seventh data element 757 of the first parity P1 using the seventh data element 727 of the third content store (C2[6]); the sixth data element 766 of the second parity P2 using the seventh data element 757 of the first parity P1 (C2[6]+C1[6]+C0[6]); the eighth data element 758 of the first parity P1 using the eighth data element 728 of the third content store (C2[7]); and the fifth data element 765 of the second parity P2 using the eighth data element 758 of the first parity P1 (C2[7]+C1[7]+C0[7]).

Figure 7F:
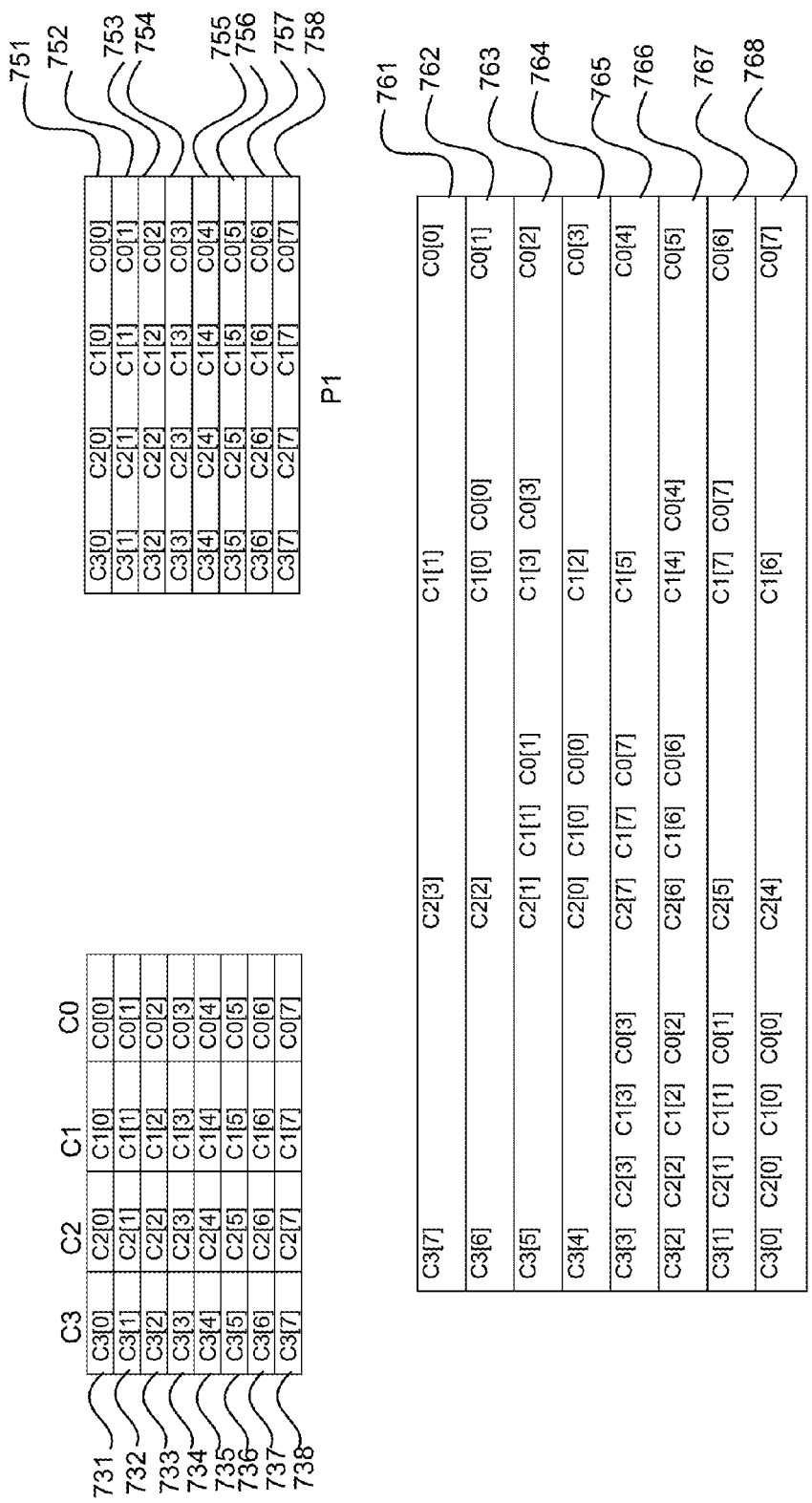

The encoding module 214 continues the method 600 as shown in the example of FIG. 7F. The encoding module 214 updates the parities in the following order: the first data element 751 of the first parity P1 using the first data element 731 of the fourth content store (C3 [0]); the eighth data element 768 of the second parity P2 using the first data element 751 of the first parity P1 (C3[0]+C2[0]+C1[0]+C0[0]); the second data element 752 of the first parity P1 using the second data element 732 of the fourth content store (C3[1]); the seventh data element 767 of the second parity P2 using the second data element 752 of the first parity P1 (C3[1]+C2[1]+C1[1]+C0[1]); the third data element 753 of the first parity P1 using the third data element 733 of the fourth content store (C3[2]); the sixth data element 766 of the second parity P2 using the third data element 753 of the first parity P1 (C3[2]+C2[2]+C1[2]+C0[2]); the fourth data element 754 of the first parity P1 using the fourth data element 734 of the fourth content store (C3[3]); the fifth data element 765 of the second parity P2 using the fourth data element 754 of the first parity P1 (C3[3]+C2[3]+C1[3]+C0[3]); the fifth data element 755 of the first parity P1 using the fifth data element 735 of the fourth content store (C3[4]); the fourth data element 764 of the second parity P2 using the fifth data element 735 of the fourth content store (C3[4]); the sixth data element 756 of the first parity P1 using the sixth data element 736 of the fourth content store (C3[5]); the third data element 763 of the second parity P2 using the sixth data element 736 of the fourth content store (C3[5]); the seventh data element 757 of the first parity P1 using the seventh data element 737 of the fourth content store (C3[6]); the second data element 762 of the second parity P2 using the seventh data element 737 of the fourth content store (C3[6]); and the eighth data element 758 of the first parity P1 using the eighth data element 738 of the fourth content store (C3[7]); the first data element 761 of the second parity P2 using the eighth data element 738 of the fourth content store (C3[7]).

After updating the second parity P2 in the example of FIG. 7F, the method 600 determines that the code word is complete. In response to determining that the code word is complete, the encoding module may write the first parity on a first content store (e.g., storage device 112) and the second parity on a second content store (e.g., storage device 112).

Although the examples of FIGS. 3, 4, 5 and 7 show parities determined for a code word where k=4, the cache oblivious algorithm may be implemented for any value of k and for any cache size. The cache oblivious algorithm for generating the butterfly code is described by the following algorithm, wherein 'k' is the number of content stores, codelen=$2^{k-1}$, 'codeoff' (code offset) is used to differentiate between various chunks of data and can assumed to be 1 for a single data chunk, and 'dir' is the direction of creating the parities (e.g., for creating the first orthogonal parity dir=1, and for creating the second orthogonal parity in an inverse orientation to the first, dir=−1):

```
if(k=2)
    p1[codeoff*1] = C[0][codeoff*1] + C[1][codeoff*1]
    p1[(codeoff+1)*1] = C[0][(codeoff+1)*1] + C[1][(codeoff+1)*1]);
        if (dir>0)
            p2[codeoff*1] = C[0][codeoff*1] + C[1][(codeoff+1)*1])
            p2[(codeoff+1)*1] = C[0][(codeoff+1)*1] + p1[codeoff*1]
        else
            p2[codeoff*1] = C[0][codeoff*1] + p1[(codeoff+1)*1])
            p2[(codeoff+1)*1] = C[0][(codeoff+1)*1] + C[1][codeoff*1])
increment k
    else
        if(dir>0)
            for row=0 to row<codelen/2
            do
                p1[(codeoff+row)*1] = p1[(codeoff+row)*1] + C[k-1][(codeoff+row)*1])
                p2[(codelen-1+codeoff-row)*1] = p2[(codelen-1+codeoff-row)*1] + p1[(codeoff+row)*1])
            end for
            for row=codelen/2 to row<codelen
            do
                p1[(codeoff+row)*1] = p1[(codeoff+row)*1] + C[k-1][(codeoff+row)*1])
                p2[(codelen-1+codeoff-row)*1] = p2[(codelen-1+codeoff-row)*1] + C [k-1][(codeoff+row)*1]);
            end for
        else
            for row=0 to row<codelen/2
            do
                p1[(codeoff+row)*1] = p1[(codeoff+row)*1] + C[k-1][(codeoff+row)*1]);
                p2[(codelen-1+codeoff-row)*1] = p2[(codelen-1+codeoff-row)*1] + C[k-1][(codeoff+row)*1]);
            end for
            for row=codelen/2 to row<codelen
            do
                p1[(codeoff+row)*1] = p1[(codeoff+row)*1] + C [k-1][(codeoff+row)*1]);
                p2[(codelen-1+codeoff-row)*1]= p2[(codelen-1+codeoff-row)*1] + p1[(codeoff+row)*1])
            end for
end
```

Figure 8:
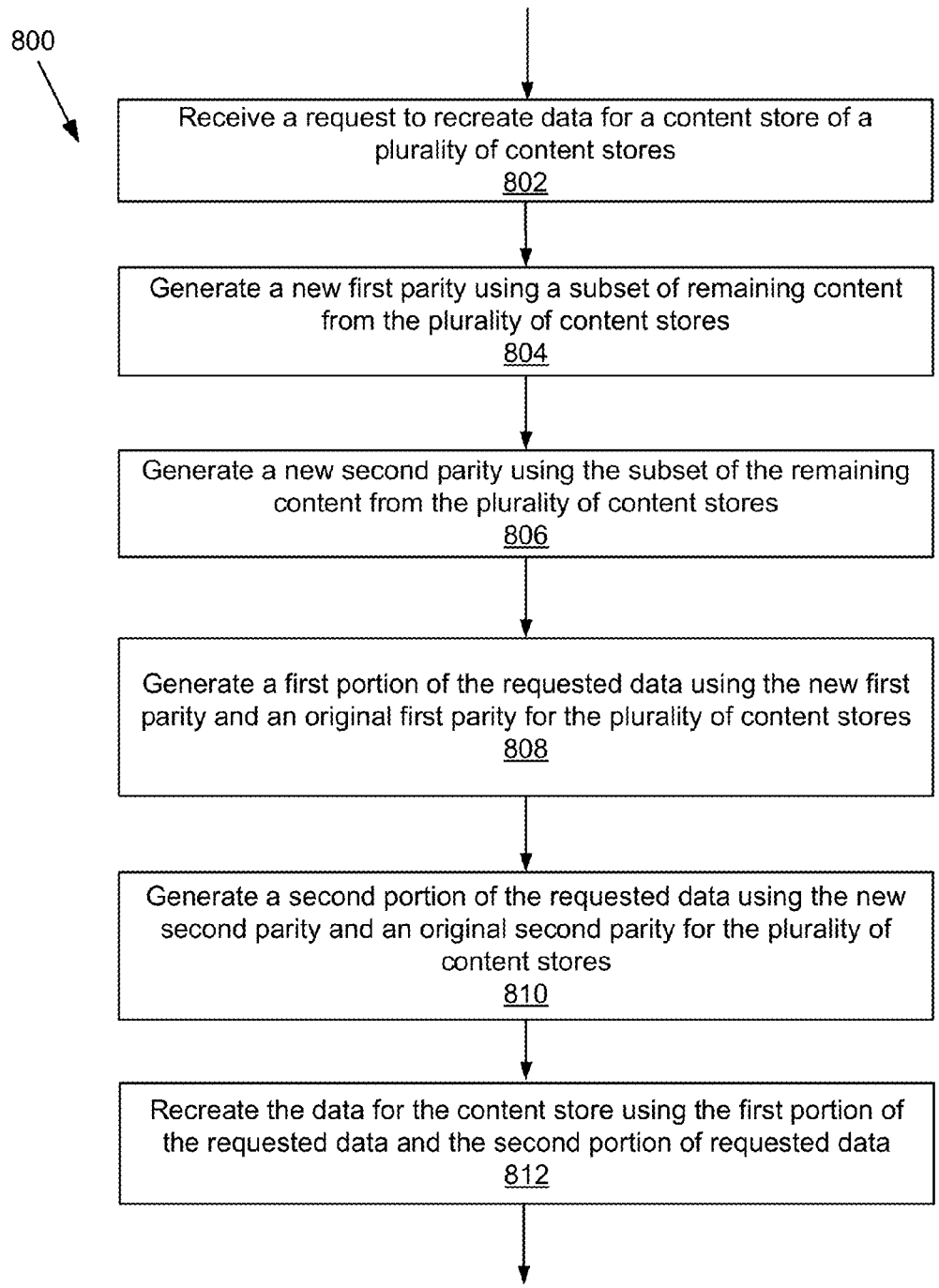
FIG. 8 is a flowchart of an example method for recreating data for a content store from a plurality of content stores including a parity, according to the techniques described herein.

FIG. 8 is a flowchart of an example method for recreating data for a content store from a plurality of content stores including a parity. At 802, the encoding module 214 receives a request to recreate data for a content store of a plurality of content stores. In one embodiment, the request may be a failure notification of a particular content store. The encoding module 214 may retrieve a subset of the content from the remaining content stores in response to a request to recreate data. In another embodiment, the encoding module may receive a request to recreate data for more than one content store. At 804, the encoding module 214 generates a new first parity using a subset of remaining content from the plurality of content stores. The encoding module 214 calculates the first parity as a horizontal parity for the subset of remaining content from the plurality of content stores. The new first parity may be calculated using methods described with reference to FIG. 6. The subset of remaining content may be selected based on the failed content store. In some embodiments, the subset of remaining content may be pre-determined for failure of a particular content store. For example, the subset of content may be half of the rows of the remaining content stores for failure of any one content store.

At 806, the encoding module 214 generates a new second parity using the subset of the remaining content from the plurality of content stores using the construction described above with reference to FIGS. 3-7. At 808, the encoding module 214 generates a first portion of the requested data using the new first parity and an original first parity for the plurality of content stores. In some embodiments, the original first parity for the plurality of content stores was encoded when the data was stored to the plurality of content stores. In one embodiment, the encoding module 214 compares the new first parity with the original first parity for the plurality of content stores to determine the first portion of the requested data. For example, the encoding module determines the first portion of the requested data using an XOR operation on the new first parity and the original first parity for the plurality of content stores. At 810, the encoding module 214 generates a second portion of the requested data using the new second parity and an original second parity for the plurality of content stores. In some embodiments, the encoding module 214 may compare the new second parity with the original second parity for the plurality of content stores. For example, in order to recreate lost data for two content stores, the comparison will result in data elements from the new first parity and the new second parity, some including more than one element of lost data. At 812, the encoding module 214 recreates the data for the content store using the first portion of the requested data and the second portion of requested data. For example, the lost data for two content stores may be obtained by linear clearing. In one embodiment, the lost data may be obtained by another XOR operation between the first portion of requested data and the second portion of the requested data. The method for recreating data for a content store is depicted in the example data shown in FIG. 9.

Figure 9:
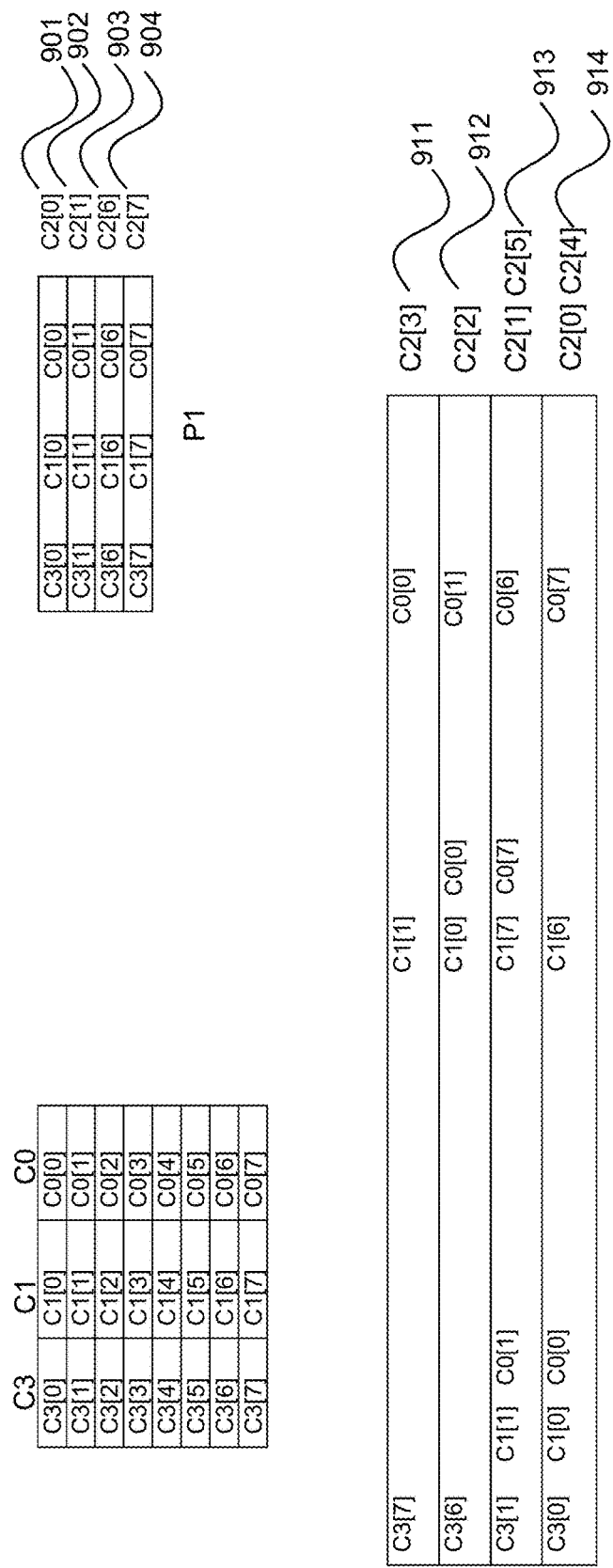
FIG. 9 depicts a block diagram illustrating an example of recreating data for a content store, according to the techniques described herein.

FIG. 9 depicts a block diagram illustrating an example of recreating data for a content store. In the example of FIG. 9, the data stored on content store C2 is lost, for example through a disk failure or the like. For one failure recovery, the present invention uses half of the remaining data elements (e.g., half of the original content stored to the content stores) to recreate the lost content store. In the example of FIG. 9, where content store C2 is lost, the remaining data used to recreate C2 is the 1st, 2nd, 6th and 7th data element of the remaining content stores. In order to recreate lost data for content store C2, the encoding module 214, generates a new first parity P1 and a new second parity P2 using techniques described herein with reference to FIGS. 3-7. The encoding module 214 then compares the new first parity with an original first parity for the plurality of content stores (e.g., the first parity P1 described above with reference to FIG. 5A) to determine a first portion of the lost data. As shown in the example of FIG. 9, the encoding module 214 generates the lost data element 901 (C2[0]) by using an XOR operation on the first data element of the new first parity and the original first data element of the first parity for the plurality of content stores, lost data element 902 (C2[1]) using an XOR operation on the second data element of the new first parity and the second data element of the original first parity for the plurality of content stores, the lost data element 903 (C2[6]) by using an XOR operation on the third data element of the new first parity and the seventh data element of the original first parity for the plurality of content stores, and the lost data element 904 (C2[7]) using an XOR operation on the fourth data element of the new first parity and the eighth data element of the original first parity for the plurality of content stores. Thus, in this example, the first portion of lost data includes the lost data elements C2[0], C2[1], C2[6] and C2[7].

The encoding module 214 may also compare the new second parity with an original second parity for the plurality of content stores (e.g., the second parity P2 described with reference to FIG. 5B) to determine a second portion of the lost data. As shown in the example of FIG. 9, the encoding module 214 generates lost data element 911 (C2[3] using an XOR operation on the first data element of the new second parity and the first data element of the original second parity for the plurality of content stores, lost data element 912 (C2[2] using an XOR operation on the second data element of the new second parity and the second data element of the original second parity for the plurality of content stores, lost data element 913 (C2[1]+C2[5]) using an XOR operation on the third data element of the new second parity and the seventh data element of the original second parity for the plurality of content stores, and lost data element 914 (C2[0]+C2[4]) using an XOR operation on the fourth data element of the new second parity and the eighth data element of the original second parity for the plurality of content stores. Thus, in this example, the second portion of lost data includes the lost data elements C2[3], C2[2], C2[1], C2[5], C2[0] and C2[4].

In some embodiments, to recover the individual lost data elements from lost data elements 913 and 914, the encoding module 214 performs an XOR operation on the lost data element 901 including C2[0] and the lost data element 914 including C2[0] and C2[4] and an XOR operation on the data element 902 including C2[1] and the data element 913 including C2[1] and C2[5]. The result is the lost data elements C2[4] and C2[5]. In the example of FIG. 9, the encoding module 214, thus obtains C2[0], C2[1], C2[6] and C2[7] from the first XOR operation using the first parities. The encoding module 214 recreates C2[3] and C2[2] using the second XOR operation on the second parities. Finally, the XOR operation between data element 913 and data element 902 recreates C2[5] and the XOR operation between data element 914 and data element 901 recreates C2[4]. The encoding module 214 may then return the result to be recreated on a new content store.

Systems and methods for a cache oblivious algorithm to generate parities for data recovery have been described. In the above description, for purposes of explanation, numerous specific details were set forth. It will be apparent, however, that the disclosed technologies can be practiced without any given subset of these specific details. In other instances, structures and devices are shown in block diagram form. For example, the disclosed technologies are described in some implementations above with reference to user interfaces and particular hardware. Moreover, the technologies disclosed above primarily in the context of on line services; however, the disclosed technologies apply to other data sources and other data types (e.g., collections of other resources for example images, audio, web pages).

Reference in the specification to "one implementation" or "an implementation" means that a particular feature, structure, or characteristic described in connection with the implementation is included in at least one implementation of the disclosed technologies. The appearances of the phrase "in one implementation" in various places in the specification are not necessarily all referring to the same implementation.

Some portions of the detailed descriptions above were presented in terms of processes and symbolic representations of operations on data bits within a computer memory. A process can generally be considered a self-consistent sequence of steps leading to a result. The steps may involve physical manipulations of physical quantities. These quantities take the form of electrical or magnetic signals capable of being stored, transferred, combined, compared, and otherwise manipulated. These signals may be referred to as being in the form of bits, values, elements, symbols, characters, terms, numbers or the like.

These and similar terms can be associated with the appropriate physical quantities and can be considered labels applied to these quantities. Unless specifically stated otherwise as apparent from the prior discussion, it is appreciated that throughout the description, discussions utilizing terms for example "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed technologies may also relate to an apparatus for performing the operations herein. This apparatus may be specially constructed for the required purposes, or it may include a general-purpose computer selectively activated or reconfigured by a computer program stored in the computer. Such a computer program may be stored in a computer readable storage medium, for example, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory or any type of media suitable for storing electronic instructions, each coupled to a computer system bus.

The disclosed technologies can take the form of an entirely hardware implementation, an entirely software implementation or an implementation containing both hardware and software elements. In some implementations, the technology is implemented in software, which includes but is not limited to firmware, resident software, microcode, etc.

Furthermore, the disclosed technologies can take the form of a computer program product accessible from a non-transitory computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computing system or data processing system suitable for storing and/or executing program code will include at least one processor (e.g., a hardware processor) coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems and Ethernet cards are just a few of the currently available types of network adapters.

Finally, the processes and displays presented herein may not be inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the disclosed technologies were not described with reference to any particular programming language. It will be appreciated that a variety of programming languages may be used to implement the teachings of the technologies as described herein.

The foregoing description of the implementations of the present techniques and technologies has been presented for the purposes of illustration and description. It is not intended to be exhaustive or to limit the present techniques and technologies to the precise form disclosed. Many modifications and variations are possible in light of the above teaching. It is intended that the scope of the present techniques and technologies be limited not by this detailed description. The present techniques and technologies may be implemented in other specific forms without departing from the spirit or essential characteristics thereof. Likewise, the particular naming and division of the modules, routines, features, attributes, methodologies and other aspects are not mandatory or significant, and the mechanisms that implement the present techniques and technologies or its features may have different names, divisions and/or formats. Furthermore, the modules, routines, features, attributes, methodologies and other aspects of the present technology can be implemented as software, hardware, firmware or any combination of the three. Also, wherever a component, an example of which is a module, is implemented as software, the component can be implemented as a standalone program, as part of a larger program, as a plurality of separate programs, as a statically or dynamically linked library, as a kernel loadable module, as a device driver, and/or in every and any other way known now or in the future in computer programming. Additionally, the present techniques and technologies are in no way limited to implementation in any specific programming language, or for any specific operating system or environment. Accordingly, the disclosure of the present techniques and technologies is intended to be illustrative, but not limiting.

What is claimed is:

1. A computer-implemented method comprising:
retrieving a first subset of content from memory;
generating a first combination of data elements from the first subset of content using a combinatorial circuit coupled with a cache memory;
updating a first parity for the content with the first combination of data elements from the first subset of content;
storing the first combination of data elements in the cache memory;
generating an orthogonal permutation based on the first subset of content by:
retrieving the first combination of data elements from the cache memory; and
processing the first combination of data elements with a first correcting factor using the combinatorial circuit;
updating a second parity for the content using the orthogonal permutation;
retrieving a second subset of content from memory;
generating a second combination of data elements from the second subset of content using the combinatorial circuit;
updating the first parity for the content with the second combination of data elements from the second subset of content;
storing the second combination of data elements in the cache memory;
generating an inverse orthogonal permutation based on the second subset of content by:
retrieving the second combination of data elements from the cache memory; and
processing the second combination of data elements with a second correcting factor using the combinatorial circuit; and
updating the second parity for the content using the inverse orthogonal permutation.

2. The computer-implemented method of claim 1, wherein the first correcting factor and the second correcting factor are based on the first parity.

3. The computer-implemented method of claim 1 further comprising:
determining that a code word is complete, wherein the content from memory includes the code word;
writing the first parity to a first content store; and
writing the second parity to a second content store.

4. The computer-implemented method of claim 1 further comprising receiving a request to recreate data for a content store of a plurality of content stores, wherein the plurality of content stores include the content from memory that is represented in the first parity and the second parity.

5. The computer-implemented method of claim 4 further comprising:
in response to receiving the request to recreate data for the content store, comparing a new first parity for a subset of remaining content in the plurality of content stores and a new second parity for the subset of remaining content in the plurality of content stores with the first parity and the second parity, respectively; and
recreating the data for the content store based on the comparison.

6. The computer-implemented method of claim 5, wherein the comparison is an "exclusive or" (XOR) operation on the new first parity and the first parity and an XOR operation on the new second parity and the second parity.

7. The computer-implemented method of claim 1 further comprising generating the inverse orthogonal permutation in a recursive pattern, wherein the recursive pattern is based on a size of the content.

8. A system comprising:
one or more processors; and
a memory storing instructions that, when executed, cause the one or more processors to:
retrieve a first subset of content;
generate a first combination of data elements from the first subset of content using a combinatorial circuit coupled with a cache memory;
update a first parity for the content with the first combination of data elements from the first subset of content;
store the first combination of data elements in the cache memory;
generate an orthogonal permutation based on the first subset of content by:
retrieving the first combination of data elements from the cache memory; and
processing the first combination of data elements with a first correcting factor using the combinatorial circuit
update a second parity for the content using the orthogonal permutation;
retrieve a second subset of content;
generate a second combination of data elements from the second subset of content using the combinatorial circuit;
update the first parity for the content with the second combination of data elements from the second subset of content;
store the second combination of data elements in the cache memory;
generate an inverse orthogonal permutation based on the second subset of content by:
retrieving the second combination of data elements from the cache memory; and
processing the second combination of data elements with a second correcting factor using the combinatorial circuit; and
update the second parity for the content using the inverse orthogonal permutation.

9. A computer program product comprising a non-transitory computer useable medium including a computer readable program, wherein the computer readable program when executed on a computer causes the computer to:
retrieve a first subset of content from memory;
generate a first combination of data elements from the first subset of content using a combinatorial circuit coupled with a cache memory;
update a first parity for the content with the first combination of data elements from the first subset of content;
store the first combination of data elements in the cache memory;
generate an orthogonal permutation based on the first subset of content by:
retrieving the first combination of data elements from the cache memory; and
processing the first combination of data elements with a first correcting factor using the combinatorial circuit;
update a second parity for the content using the orthogonal permutation;
retrieve a second subset of content from memory;

generate a second combination of data elements from the second subset of content using the combinatorial circuit;
update the first parity for the content with the second combination of data elements from the second subset of content;
store the second combination of data elements in the cache memory;
generate an inverse orthogonal permutation based on the second subset of content by:
   retrieving the second combination of data elements from the cache memory; and
   processing the second combination of data elements with a second correcting factor using the combinatorial circuit; and
update the second parity for the content using the inverse orthogonal permutation.

* * * * *